United States Patent
Hsu et al.

(10) Patent No.: US 6,952,038 B2
(45) Date of Patent: Oct. 4, 2005

(54) 3D POLYSILICON ROM AND METHOD OF FABRICATION THEREOF

(75) Inventors: Tzu-Hsuan Hsu, Chiai (TW); Ming-Hsiu Lee, Hsinchu (TW); Hsiang-Lan Lung, Hsinchu (TW); Chao-I Wu, Tainan (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/728,767

(22) Filed: Dec. 8, 2003

(65) Prior Publication Data

US 2005/0124116 A1 Jun. 9, 2005

(51) Int. Cl.⁷ .................. H01L 31/113; H01L 21/336
(52) U.S. Cl. .................. 257/390; 257/401; 438/257
(58) Field of Search .................. 438/257; 257/390, 257/401, 315

(56) References Cited

U.S. PATENT DOCUMENTS 6,794,280 B2 * 9/2004 Chang .................. 438/587

* cited by examiner

Primary Examiner—David Nelms
Assistant Examiner—Long Tran
(74) Attorney, Agent, or Firm—Rabin & Berdo, P.C.

(57) ABSTRACT

A 3D polysilicon ROM including an isolated $SiO_2$ layer on a silicon substrate, and an N+ polysilicon layer on the isolated $SiO_2$ layer. The N+ polysilicon layer is further defined by a plurality of parallel, separate word lines. A first oxide layer fills the space between the word lines. A dielectric layer is deposited on the word lines and the first oxide layer. A P– polysilicon layer is deposited on the dielectric layer and further defines a plurality of parallel, separate bit lines. The bit lines overlap the word lines, from a top view, to form an approximately cross shape. The neck structure may be individually formed between the P– and N+ polysilicon layers by wet etching the dielectric layer with dilute hydrofluoric acid. A second oxide layer fills the space between the bit lines and is on the word lines and the first oxide layer.

16 Claims, 10 Drawing Sheets

3D POLYSILICON ROM AND METHOD OF FABRICATION THEREOF

BACKGROUND OF THE INVENTION

1. Field of the Invention

The invention relates in general to a polysilicon read only memory (ROM) and method of fabrication thereof, and more particularly to a 3D polysilicon ROM and method of fabrication thereof.

2. Description of the Related Art 3D memories can be much lower cost than conventional 2D memories. If a conventional memory occupies A square millimeters of silicon area, then a 3D memory comprising N planes of bits occupies approximately (A/N) square millimeters of silicon area. Reduced area means that more finished memory devices can be built on a single wafer, thereby reducing cost. Thus there is a strong incentive to pursue 3D memories having many planes of memory cells.

FIG. 1 is a cross-sectional view showing a conventional 3D polysilicon ROM. Referring first to FIG. 1, which is a cross-sectional vies along the direction of bit lines, a conventional 3D polysilicon read only memory (ROM) 10 is a multilayer structure and includes at least: a silicon substrate 110, an isolated silicon dioxide ($SiO_2$) layer 111, a N-Type heavily doped (N+) polysilicon layer 120, a dielectric layer 130, a P-Type lightly doped (P−) polysilicon layers 140, a oxide layer 124.

The isolated $SiO_2$ layer 111 is deposited on the silicon substrate 110, and the N-Type heavily doped (N+) polysilicon layer 120 is deposited on the isolated $SiO_2$ layer 111. The N+ polysilicon layer 120 is further defined a plurality of parallel, separate word lines (WL), such as word lines 122a, 122b, 122c in FIG. 1. The oxide layer 124 is filled in the space between the word lines 122a, 122b, 122c. The dielectric layer 130 is deposited on the word lines 122a, 122b, 122c and on the oxide layer 124.

The P-Type lightly doped (P−) polysilicon layer 140 is deposited on the dielectric layer 130 and further defines a plurality of parallel, separate bit lines (BL). The bit lines overlap the word lines 122a, 122b, 122c, from a top view, to form a shape approximating a cross.

However, the antifuse breakdown voltage is high between two polysilicon layers in the conventional 3D polysilicon ROM. And, the asymmetrical structure would result in different programming voltage, on current for sense amplifier. In general, the oxide breakdown voltage is high, so it's a key issue to reduce programming voltage. Moreover, the antifuse breakdown is hard to define if the antifuse material is uniform and rough. The antifuse breakdown region is hard to define, so the programming voltages are difficult to be controlled. Hence, the yield in array architectures is low.

SUMMARY OF THE INVENTION

In view of the foregoing, it is an object of the present invention to provide a 3D polysilicon ROM to decrease the required antifuse breakdown voltage which is applied for the occurrence of current breakdown with high electrical breakdown field between two polysilicon layers. And the invention also could well confine the memory cell and well confine the breakdown region so that yield in processing can be improved.

An object of the present invention is to provide a 3D polysilicon ROM at least including: a silicon substrate, an isolated silicon dioxide ($SiO_2$) layer, a N-Type heavily doped (N+) polysilicon layer, a first oxide layer, a dielectric layer, a P-Type lightly doped (P−) polysilicon layer, at least a neck structures, and a second oxide layer. The isolated $SiO_2$ layer is deposited on the silicon substrate, and the N+ polysilicon layer is deposited on the isolated $SiO_2$ layer. The N+ polysilicon layer is further defined a plurality of parallel, separate word lines (WL), and the first oxide layer is filled in the space between the word lines. The dielectric layer is deposited on the word lines and the first oxide layer. The P-Type lightly doped (P−) polysilicon layer is deposited on the dielectric layer and is further defined a plurality of parallel, separate bit lines (BL). The bit lines overlap the word lines, from a top view, to form a shape approximately as a cross. There is at least one neck structure individually formed between the first polysilicon layer and the second polysilicon layer by isotropy wet etching the dielectric layer, with using dilute hydrofluoric acid (HF) as the example. The second oxide layer is filled in the space between the bit lines and is on the word lines and the first oxide layer.

According to another aspect of the present invention, another 3D polysilicon ROM is provided. The 3D polysilicon ROM includes: a silicon substrate, an isolated silicon dioxide ($SiO_2$) layer, a plurality of word lines (WL), a plurality of bit line (BL) sections, a plurality of dielectric sections, at least a neck structure, a first oxide layer, a plurality of bit lines, a second oxide layer. The isolated $SiO_2$ layer is deposited on the silicon substrate and there are a plurality of parallel, separate word lines (WL) defined on the isolated $SiO_2$ layer silicon substrate. A plurality of parallel, separate bit line (BL) sections are formed on the word lines separately. A plurality of parallel, separate dielectric sections are formed below the BL sections one by one, each one being with respect to the BL sections thereon and all being on the word lines. There is at least one neck structure individually formed for the dielectric sections with respect to the bit lines thereon. The first oxide layer is filled in the space between the word lines, in the space between the BL sections, in the space between the dielectric sections, and is on the word lines. A plurality of parallel, separate bit lines are defined on the BL sections and on the first oxide layer. The bit lines overlap the word lines, from a top view, to form a shape approximately as a cross and the bit lines are electrically coupled to the BL sections thereabout. The second oxide layer is filled in the space between the bit lines and is on the first oxide layer over the word lines.

Other objects, features, and advantages of the invention will become apparent from the following detailed description of the preferred but non-limiting embodiments. The following description is made with reference to the accompanying drawings.

DETAILED DESCRIPTION OF THE INVENTION

The present invention now will be described more fully hereinafter with reference to the accompanying drawings, in which two examples in accordance with the preferred embodiment of the invention are shown. This invention may, however, be embodied in many different forms and should not be construed as limited to the examples set forth herein; rather, these examples are provided so that this disclosure will be thorough and complete, and will fully convey the scope of the invention to those skilled in the art. Like numbers refer to like components throughout.

EXAMPLE 1

Figure 1:
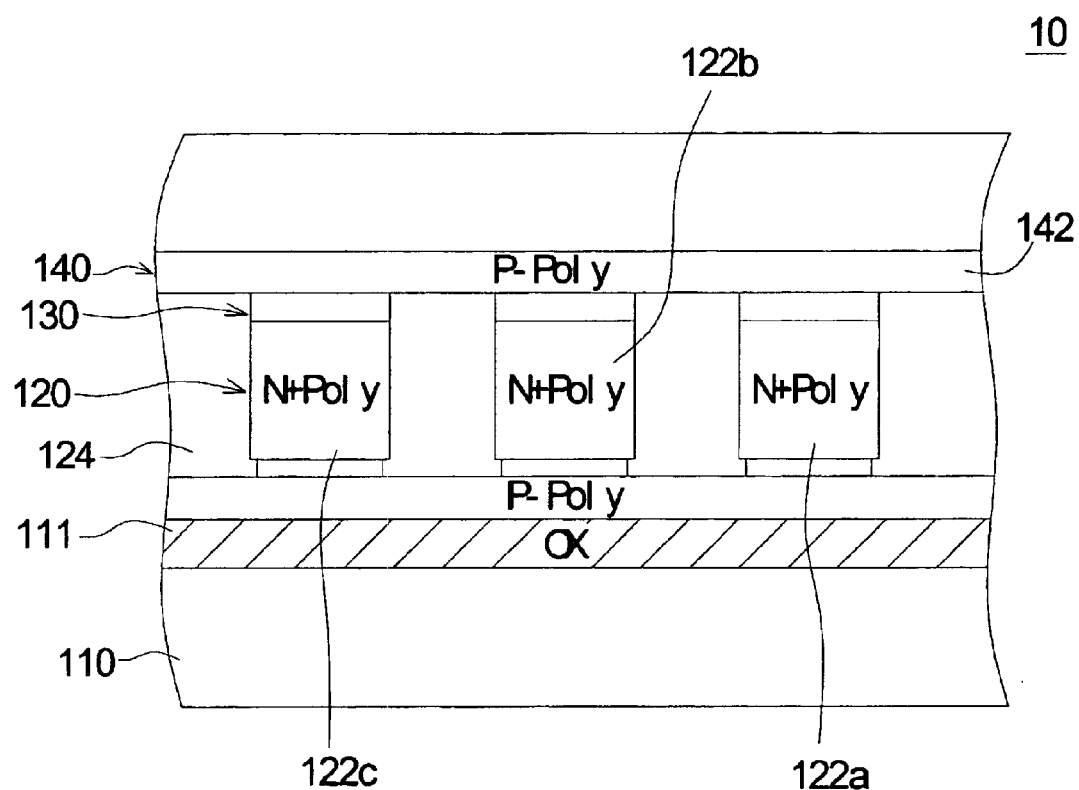
FIG. 1 (Prior Art) is a cross-sectional view showing a conventional 3D polysilicon ROM.
Figure 2A:
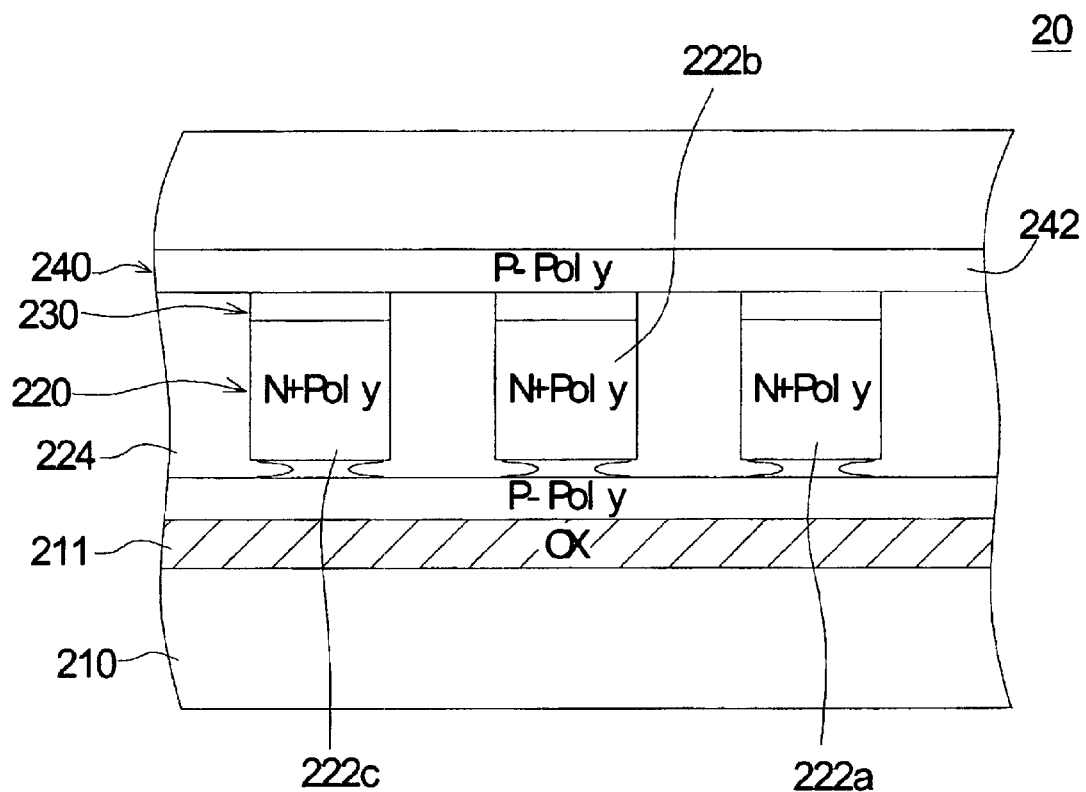
FIG. 2A is a cross-sectional view showing a 3D polysilicon ROM of the first example of the invention.
Figure 2B:
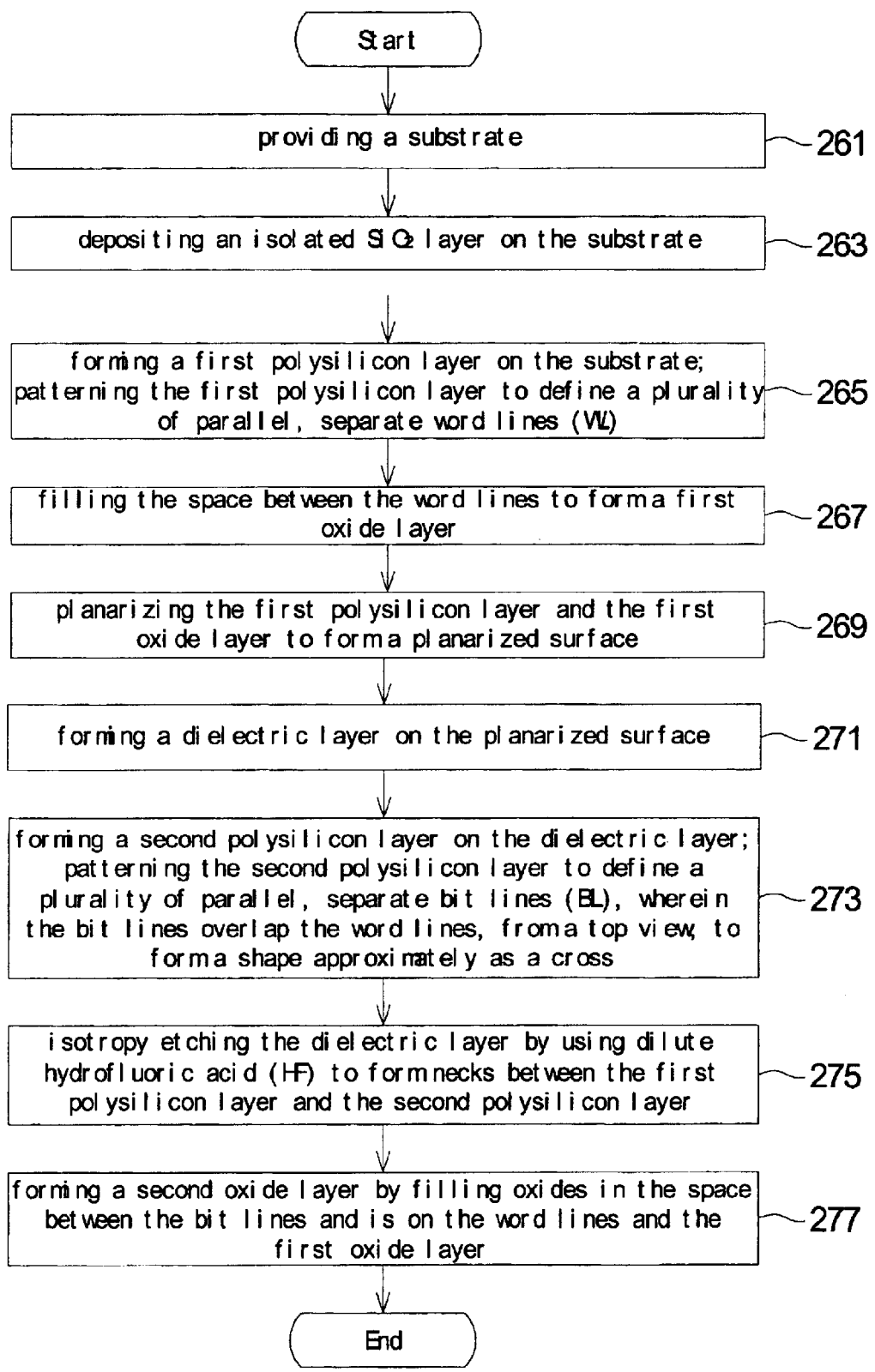
FIG. 2B is a flow chart showing the method of fabrication for the 3D polysilicon ROM according to the first example of the invention.
Figure 2C:
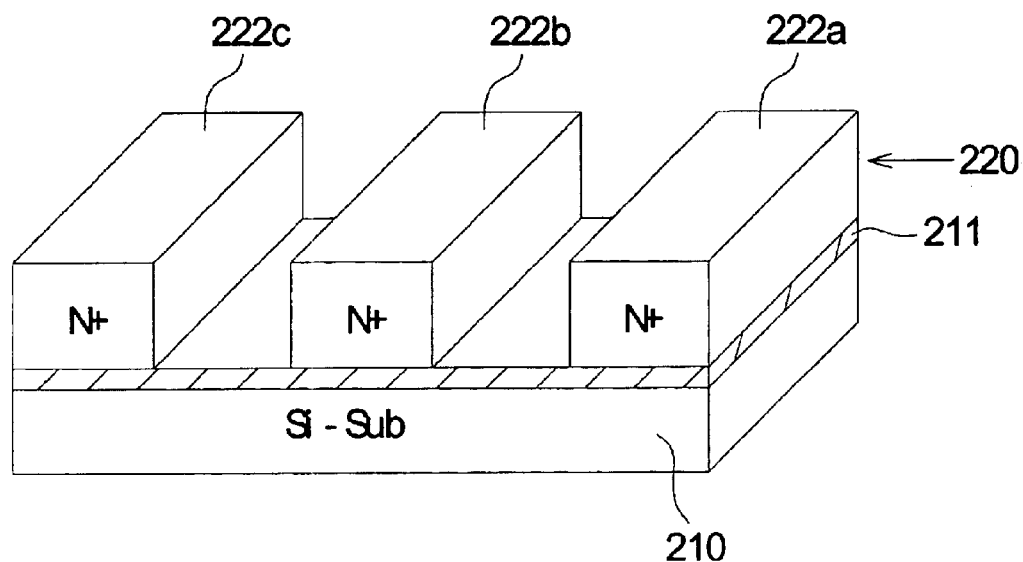
FIG. 2C to 2H are cross-sectional views showing the process steps of the first example of the method of fabrication for the 3D polysilicon ROM.
Figure 2D:
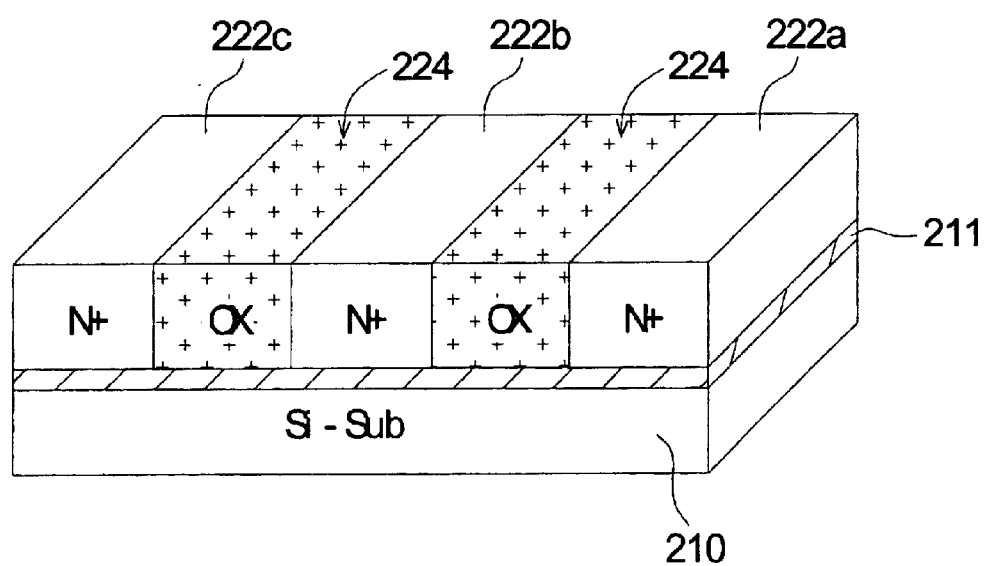
Figure 2E:
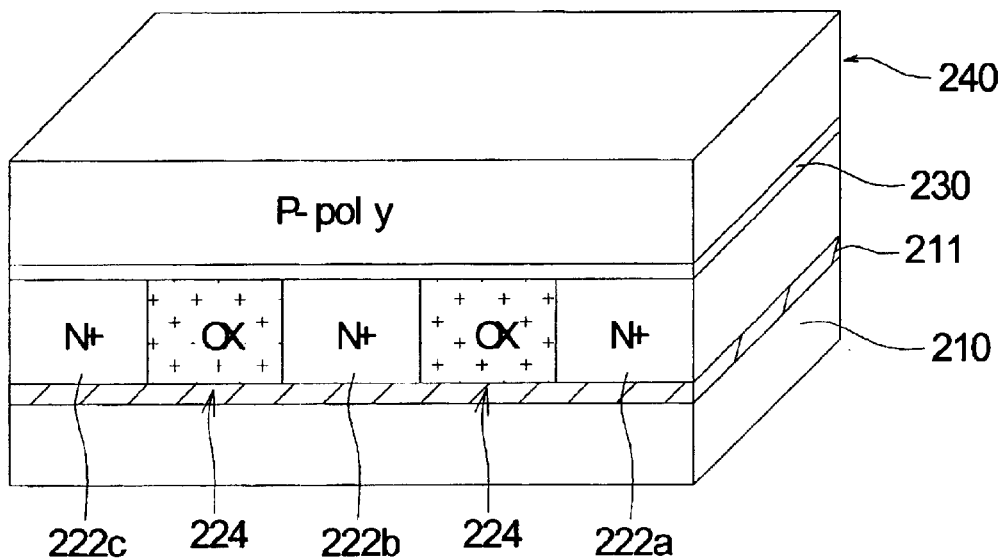

FIG. 2A is a cross-sectional view showing a 3D polysilicon ROM of the first example of the invention. Referring to FIG. 2A and FIG. 2H, a 3D polysilicon read only memory (ROM) 20 includes a silicon substrate 210, an isolated silicon dioxide ($SiO_2$) layer 211, a N-Type heavily doped (N+) polysilicon layer 220, a dielectric layer 230, a P-Type lightly doped (P−) polysilicon layers 240, a first oxide layer 224, and a second oxide layer 244 (shown in FIG. 2H).

The isolated $SiO_2$ layer 211 is deposited on the silicon substrate 210, and the N-Type heavily doped (N+) polysilicon layer 220 is deposited on the isolated $SiO_2$ layer 211. The N+ polysilicon layer 220 is further defined a plurality of parallel, separate word lines (WL), such as word lines 222a, 222b, 222c in FIG. 2A. The first oxide layer 224 is filled in the space between the word lines 222a, 222b, 222c. The dielectric layer 230 is deposited on the word lines 222a, 222b, 222c and on the first oxide layer 224.

Figure 2F:
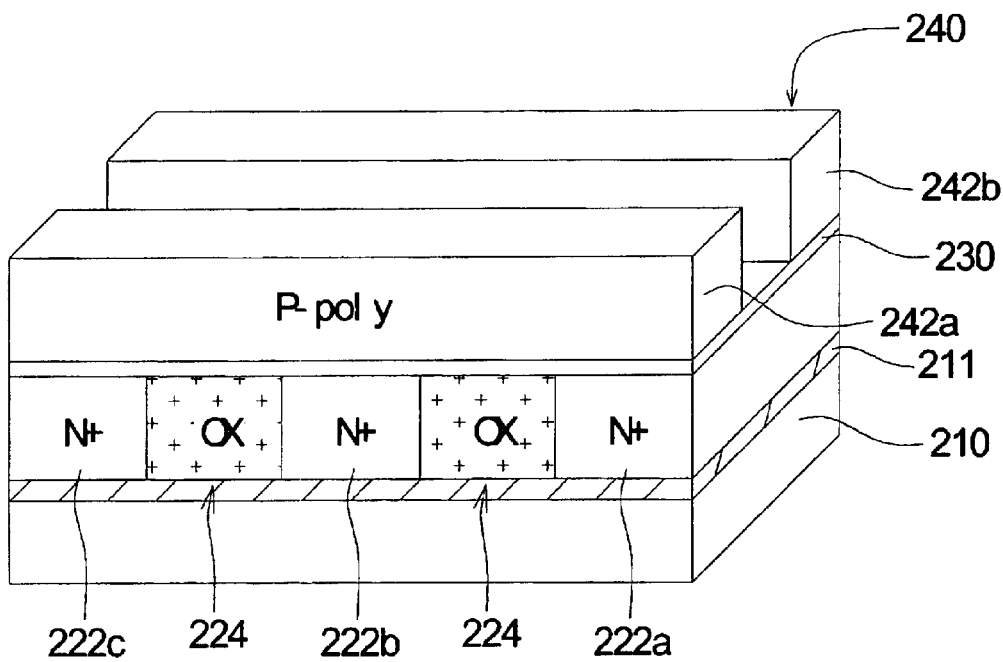

The P-Type lightly doped (P−) polysilicon layer 240 is deposited on the dielectric layer 230 and further defines a plurality of parallel, separate bit lines (BL), such as bit lines 242a, 242b in FIG. 2F. The bit lines 242a, 242b overlap the word lines 222a, 222b, 222c, from a top view, to form a shape approximating a cross.

Moreover, there is at least one neck structure, such as neck 231a, 231b (shown in FIGS. 2G and 2H), individually formed between the N-Type heavily doped (N+) polysilicon layer 220 and the P-Type lightly doped (P−) polysilicon layer 240 by isotropically etching the dielectric layer. The neck 231a, 231b (shown in FIGS. 2G and 2H) are under the bit lines 242a, 242b, respectively. The second oxide layer 244 is filled in the space between the bit lines 242a, 242b and is on the word lines 222a, 222b, 222c and on the first oxide layer 224.

FIG. 2B is a flow chart showing the method of fabrication for the 3D polysilicon ROM according to the first example of the invention, and FIG. 2C to 2H are cross-sectional views showing the process steps of the first embodiment of the method of fabrication for the 3D polysilicon ROM. Referring first to FIG. 2B, as described in step 261, a substrate 210 is provided. Then, as described in step 263, an isolated $SiO_2$ layer 211 is deposited on the substrate 210. As described in step 265, a N-Type heavily doped (N+) polysilicon layer 220 is formed on the isolated $SiO_2$ layer 211; the N-Type heavily doped (N+) polysilicon layer is further patterned to define a plurality of parallel, separate word lines (WL) 222a, 222b, 222c, as shown in FIG. 2C.

As described in step 267, the space between the word lines 222a, 222b, 222c is filled to form a first oxide layer 224, as shown in FIG. 2D. And then, as described in step 269, the N-Type heavily doped (N+) polysilicon layer 220 and the first oxide layer 224 are planarized to form a planarized surface. In FIG. 2E, as described in step 271, a dielectric layer 230 is formed on the planarized surface, i.e. the dielectric layer 230 is formed on the word lines 222a, 222b, 222c, and on the first oxide layer 224.

As described in step 273, a P-Type lightly doped (P−) polysilicon layer 240 is formed on the dielectric layer 230; the P-Type lightly doped (P−) polysilicon layer 240 is patterned to define a plurality of parallel, separate bit lines (BL) 242a, 242b. The bit lines 242a, 242b overlap the word lines 222a, 222b, 222c, from a top view, to form a shape approximately as a cross, as shown in FIG. 2F.

Figure 2G:
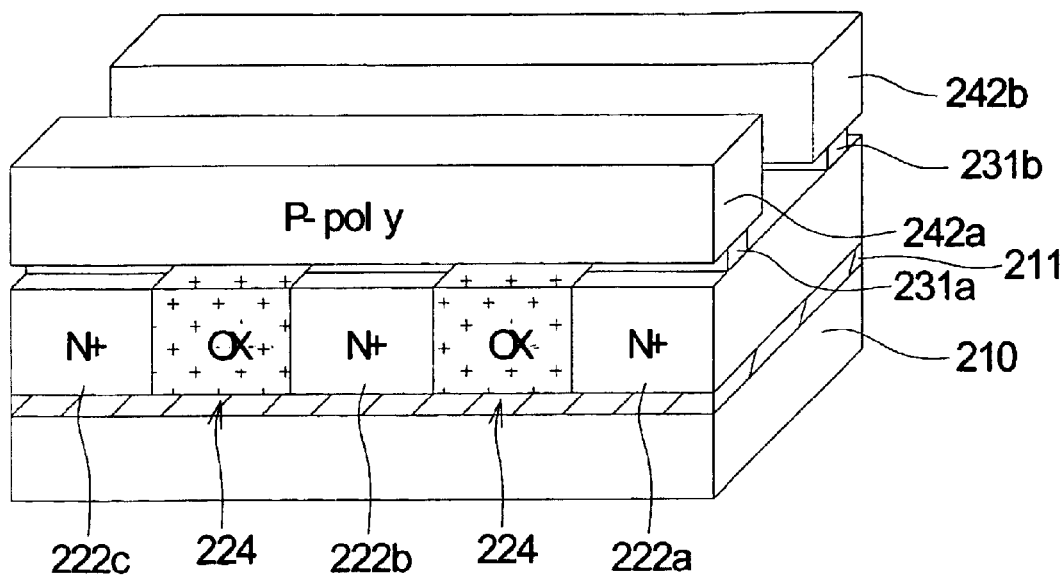
Figure 2H:
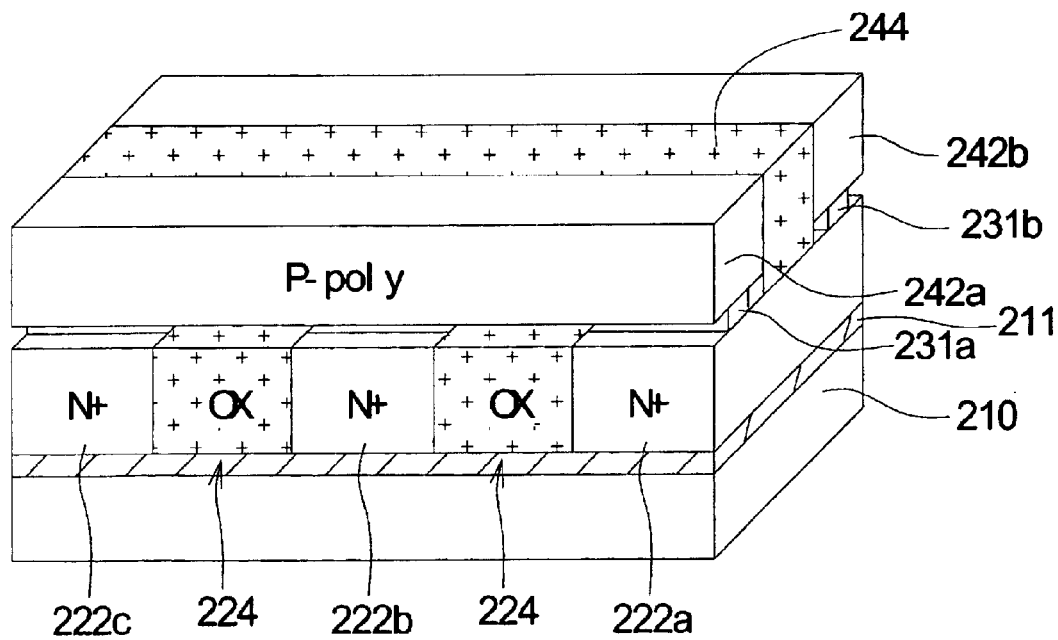

Then, as described in step 275, the dielectric layer 230 is isotropy etched by wet etching, with preferably using dilute hydrofluoric acid (HF) here as the example, to form two continuing narrow necks 231a, 231b between the N-Type heavily doped (N+) polysilicon layer 220 and the P-Type lightly doped (P−) polysilicon layer, as shown in FIG. 2G. Finally, as described in step 277, a second oxide layer 244 is formed by filling oxides in the space between the bit lines 242a, 242b and is on the word lines 222a, 222b, 222c and the first oxide layer 224, as shown in FIG. 2H.

The present inventions of the first example are not limited in what are described above. For example, user can repeat the process steps in accordance with the method discloses in FIG. 2B and make multi-layer stacks to meet their demands. Moreover, the dielectric layer 230 preferably can be made of silicon dioxide ($SiO_2$), silicon nitride ($Si_3N_4$), aluminum oxide ($Al_2O_3$), hafnium oxide ($HfO_2$) or zirconium oxide ($ZrO_2$). Also, the different etching solutions are used with respect to the concerned material of the dielectric layer 230, such as dilute hydrofluoric acid (HF) used in the first example of the invention. In addition, the N-Type heavily doped (N+) polysilicon layer 220 and the P-Type lightly doped (P−) polysilicon layers 240, both can be replaced by a sandwich structure of polysilicon/silicide/polysilicon in order to reduce the corresponding resistance. The oxide layer 222,224 can be filled by high density plasma (HDP) in a blanket deposition in the space between the bit lines 222a, 222b, 222c, and between the word lines 242a, 242b, respectively. Moreover, the oxide layer 222,224 can be made of silicon nitride ($Si_3N_4$), Borophosphosilicate glass (BPSG), a polymer or a low K material.

EXAMPLE 2

Figure 3A:
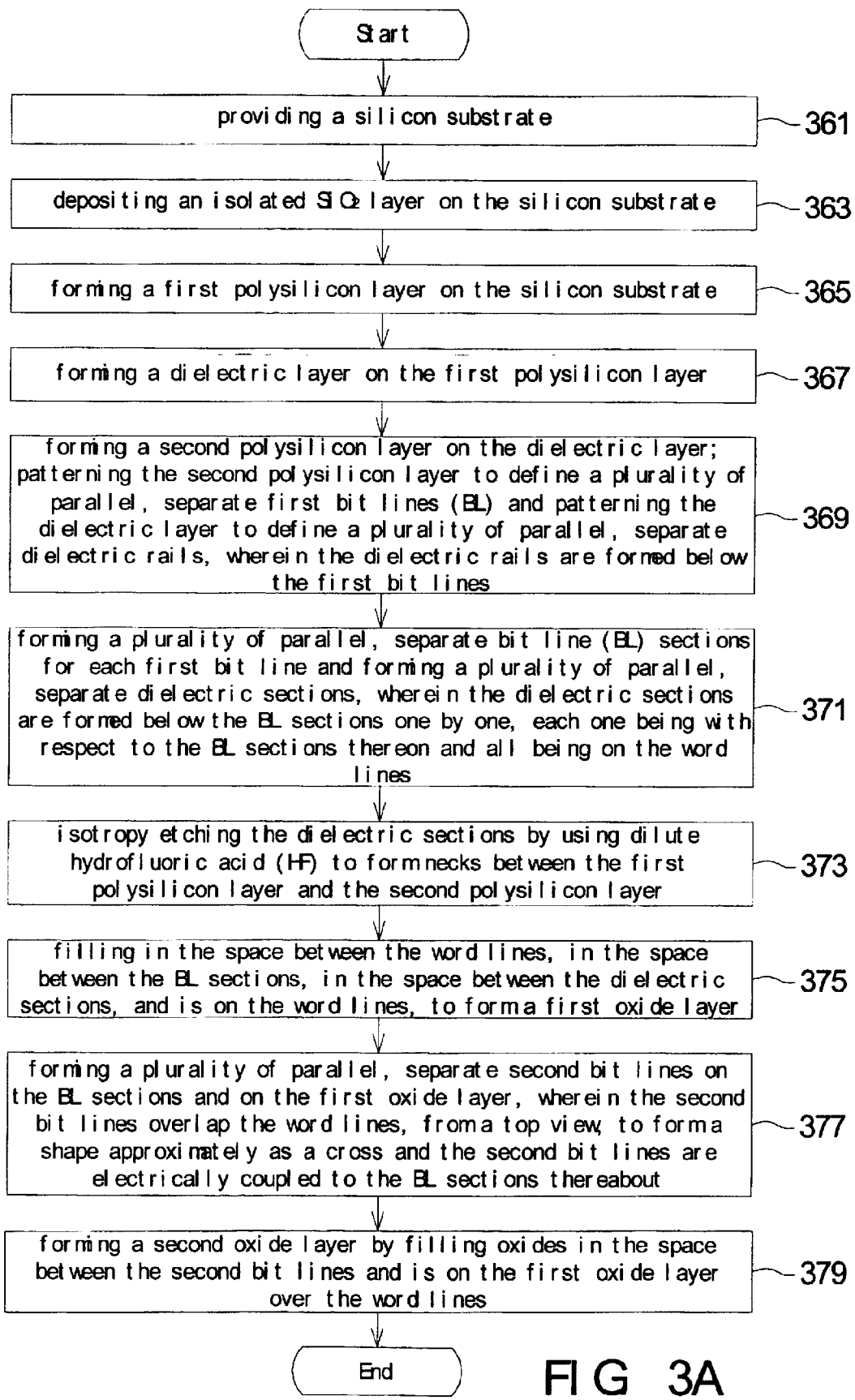
FIG. 3A is a flow chart showing the method of fabrication for the 3D polysilicon ROM according to the second example of the invention.
Figure 3B:
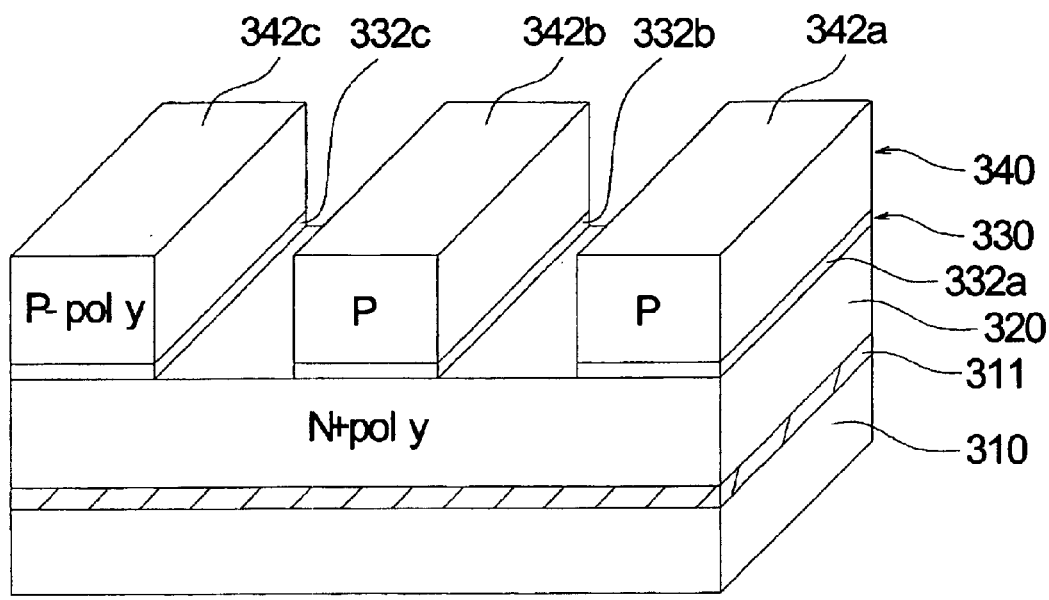
FIG. 3B to 3F are cross-sectional views showing the process steps of the second example of the method of fabrication for the 3D polysilicon ROM.
Figure 3C:
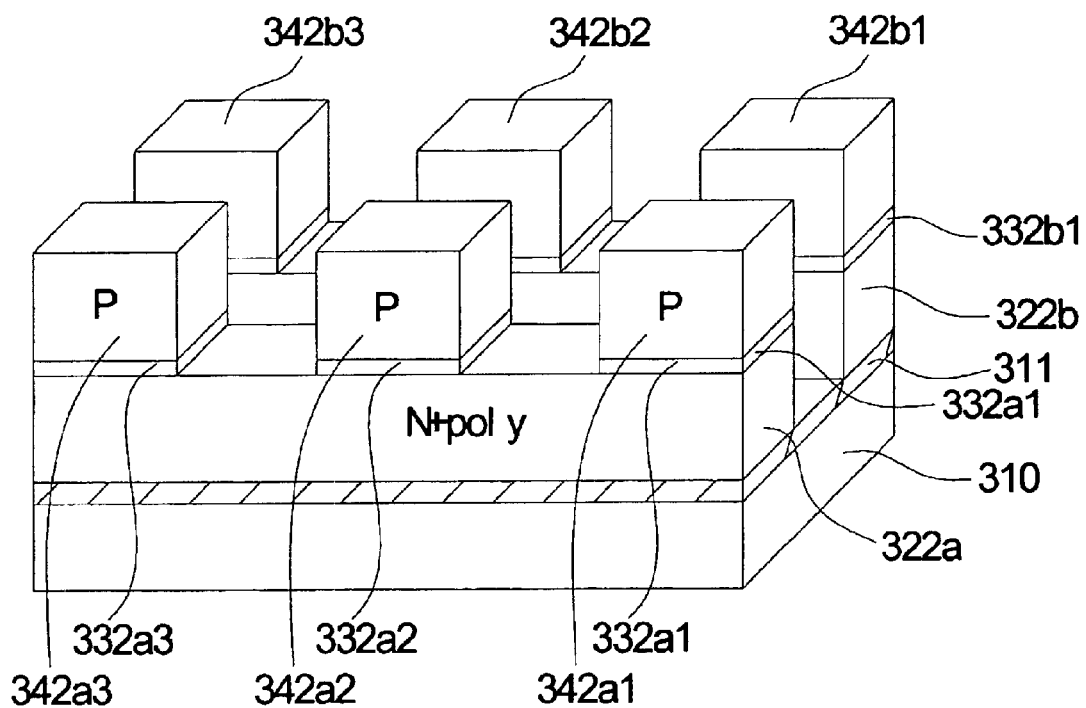
Figure 3D:
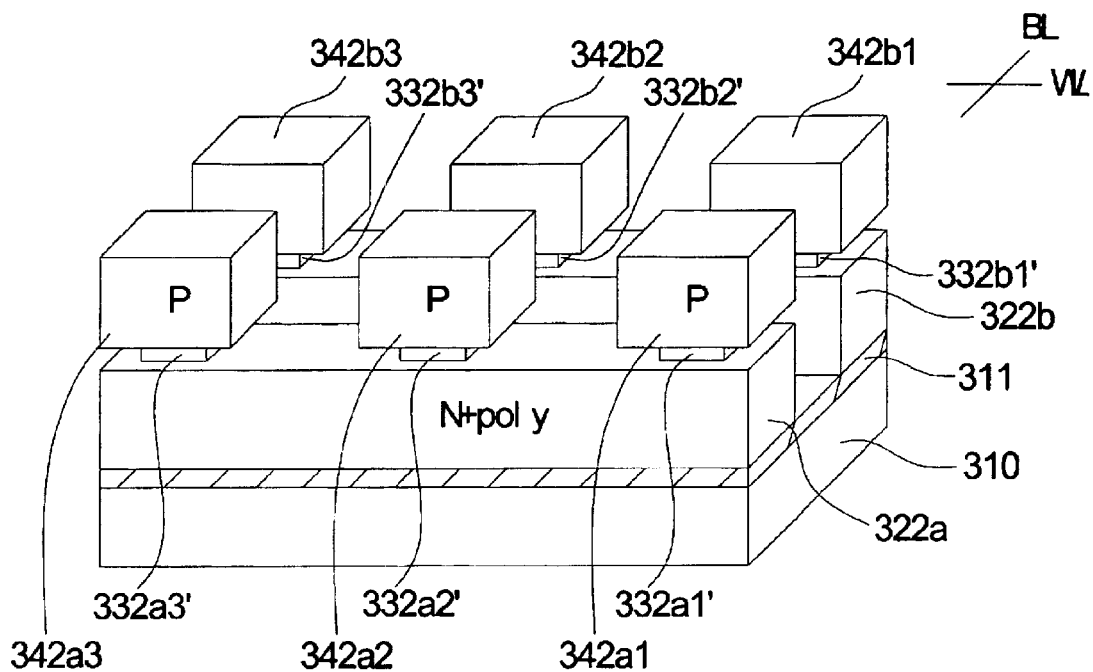
Figure 3E:
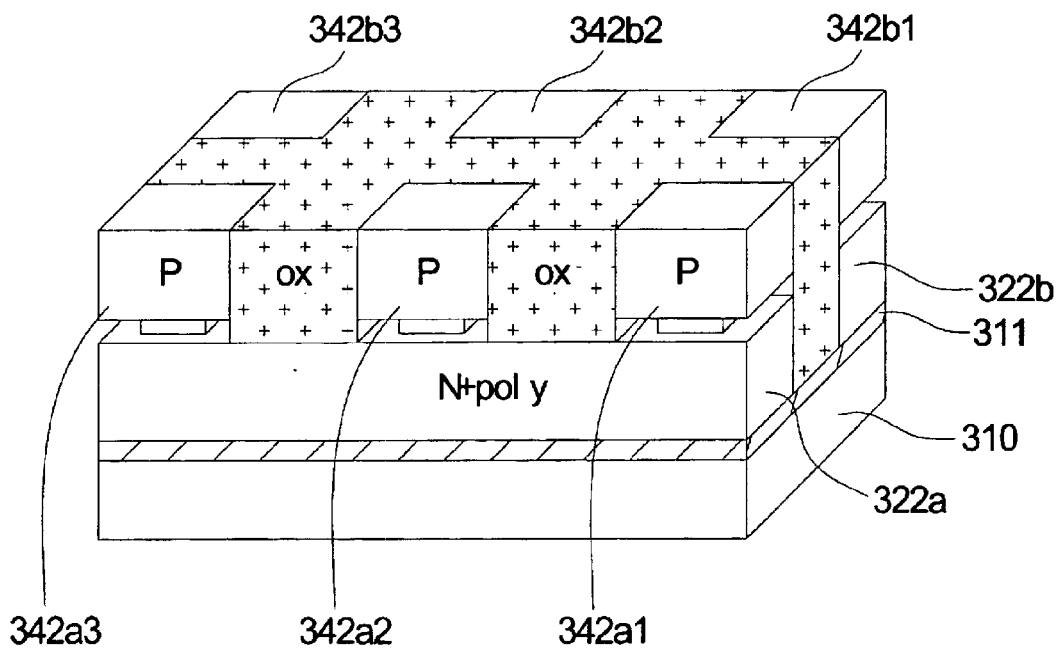
Figure 3F:
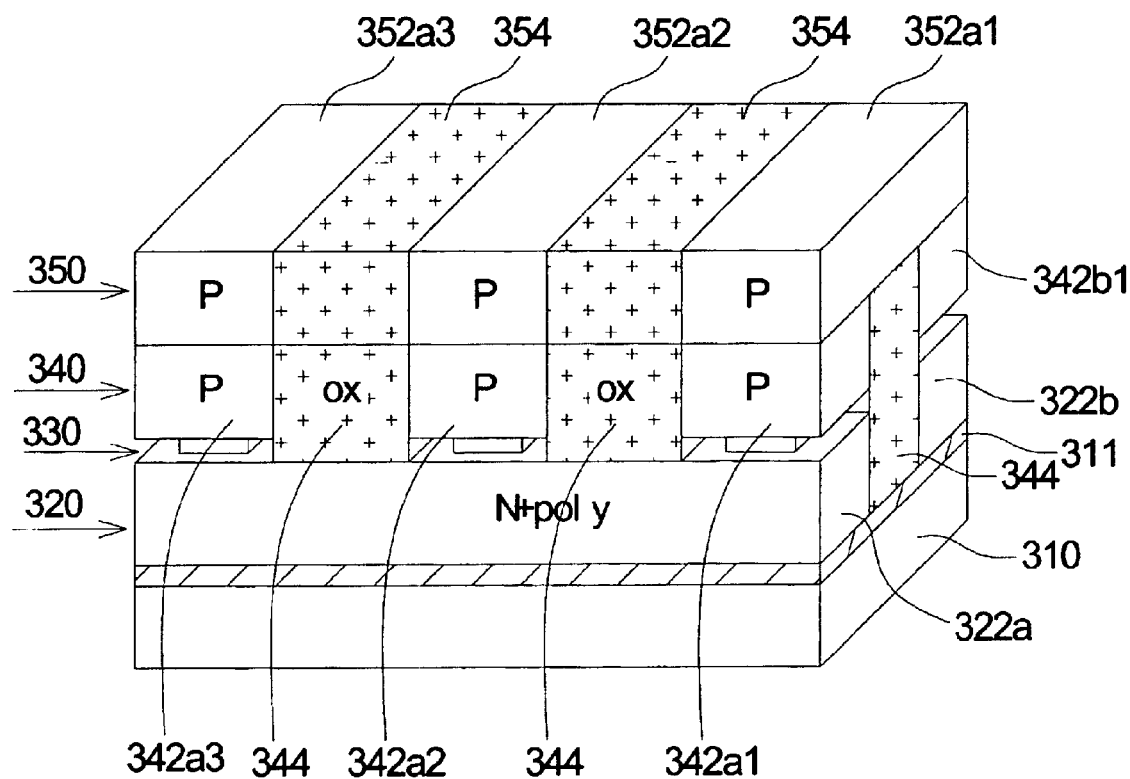

FIG. 3A is a flow chart showing the method of fabrication for the 3D polysilicon ROM according to the second embodiment of the invention, and FIG. 3B to 3F are cross-sectional views showing the process steps of the second embodiment of the method of fabrication for the 3D polysilicon ROM. Referring first to FIG. 3F, a 3D polysilicon read only memory (ROM) 30 includes a silicon substrate 310, an isolated silicon dioxide ($SiO_2$) layer 311, a N-Type heavily doped (N+) polysilicon layer 320, a dielectric layer 330, P-Type lightly doped (P−) polysilicon layers 340, 350, and oxide layers 344, 354.

The method of fabrication for the 3D polysilicon ROM according to the second embodiment of the invention is described below. First, as described in step 361, a silicon substrate 310 is provided. Then, as described in step 363, an isolated $SiO_2$ layer 311 is deposited on the substrate 310. As described in step 365, a N-Type heavily doped (N+) polysilicon layer 320 is formed on the isolated $SiO_2$ layer 311. Then, as described in step 367, a dielectric layer 330 is formed on the N-Type heavily doped (N+) polysilicon layer 320.

As described in step 369, a P-Type lightly doped (P−) polysilicon layer 340 is formed on the dielectric layer 330;

the P-Type lightly doped (P−) polysilicon layer 340 is patterned to define a plurality of parallel, separate first bit lines (BL) 342a, 342b, 342c. Moreover, the dielectric layer 330 is further patterned to define a plurality of parallel, separate dielectric rails 332a, 332b, 332c, and the dielectric rails 332a, 332b, 332c are formed below the bit lines 342a, 342b, 342c individually, as shown in FIG. 3B.

Further, as described in step 371, a plurality of parallel, separate bit line (BL) sections are formed for each first bit line, and a plurality of parallel, separate dielectric sections are formed, i.e. BL sections 342a1, 342b1 and dielectric sections 332a1, 332b1 are formed for bit line 342a and for the dielectric rail 332a. BL sections 342a2, 342b2 and dielectric sections 332a2, 332b2 are formed for bit line 342b and for the dielectric rail 332b. BL sections 342a3, 242b3 and dielectric sections 332a3, 332b3 are formed for bit line 342c and for the dielectric rail 332c. The dielectric sections 332a1, 332a2, 332b1, 332b2, 332c1, 332c2 are formed below the BL sections 342a1, 242b1, 342a2, 342b2, 342a3, 342b3, and each one dielectric section is with respect to the BL sections thereon and all dielectric sections are on the word lines 332a, 332b, as shown in FIG. 3C.

As described in step 373, the dielectric sections 332a1, 332a2, 332a3, 332b1, 332b2, 332b3 are isotropy etched by wet etching, with preferably using dilute hydrofluoric acid (HF) here as the example, to form an isolated neck along the word line direction and to form another isolated neck along the bit line direction between the N-Type heavily doped (N+) polysilicon layer 320 and the P-Type lightly doped (P−) polysilicon layer 340, so that the dielectric sections 332a1', 332a2', 332a3', 332b1', 332b2', 332b3'. The dielectric sections 332a1', 332a2', 332a3', 332b1', 332b2', 332b3' are located with respect to the BL sections 342a1, 342a2, 342b1, 342b2, 342a3, 342b3, as shown in FIG. 3D.

As described in step 375, a first oxide layer 344 is formed by filling in the space between the word lines 322a, 322b, in the space between the BL sections 342a1, 342a2, 342b1, 342b2, 342a3, 342b3, in the space between the dielectric sections 332a1', 332a2', 332a3', 332b1', 332b2', 332b3', and is on the word lines 322a, 322b, as shown in FIG. 3E.

As described in step 377, a plurality of parallel, separate second bit lines are formed on the BL sections and on the first oxide layer, i.e. the second bit line 352a1 is formed on the BL sections 342a1, 342b1 and on the first oxide layer 344 and the second bit line 352a1 is electrically coupled to the BL sections 342a1, 342b1. The second bit line 352a2 is formed on the BL sections 342a2, 342b2 and on the first oxide layer 344, and the second bit line 352a2 is electrically coupled to the BL sections 342a2, 342b2. The second bit line 352a3 is formed on the BL sections 342a3, 342b3 and on the first oxide layer 344, and the second bit line 352a3 is electrically coupled to the BL sections 342a3, 342b3. The second bit lines 352a1, 352a2, 352a3 overlap the word lines 322a, 322b, from a top view, to form a shape approximately as a cross. Finally, as described in step 379, a second oxide layer 354 is formed by filling oxides in the space between the second bit lines 352a1, 352a2, 352a3 and is on the first oxide layer over the word lines, as shown in FIG. 3F.

The present inventions of the second example are not limited in what are described above. For example, user can repeat the process steps in accordance with the method discloses in FIG. 3A and make multi-layer stacks to meet their demands. Moreover, the dielectric layer 330 preferably can be made of silicon dioxide ($SiO_2$), silicon nitride ($Si_3N_4$), aluminum oxide ($Al_2O_3$), hafnium oxide ($HfO_2$) or zirconium oxide ($ZrO_2$). Also, the different etching solutions are used with respect to the concerned material of the dielectric layer 230, such as dilute hydrofluoric acid (HF) used in the second example of the invention. In addition, the N-Type heavily doped (N+) polysilicon layer 320 and the P-Type lightly doped (P−) polysilicon layers 340,350 all can be replaced by a sandwich structure of polysilicon/silicide/polysilicon in order to reduce the corresponding resistance. The oxide layer 344,354 can be filled by high density plasma (HDP) in a blanket deposition in the space between the BL sections 342a1, 342a2, 342a, 342b1, 342b2, 342b3, the dielectric sections 332a1', 332a2', 332a3', 332b1', 332b2', 332b3', and between the bit lines 352a1, 352a2, 352a3, respectively. Moreover, the oxide layer 344,354 can be made of silicon nitride ($Si_3N_4$), Borophosphosilicate glass (BPSG), a polymer or a low K material.

In summary, the invention achieves the above-identified object by providing an improved 3D polysilicon ROM which is fabricated by wet etching, with preferably using dilute hydrofluoric acid (HF) as the example, to form a neck (undercut) structure between two polysilicon layers. The advantages of the neck structure are able to decrease the required antifuse breakdown voltage, to well confine the memory cell and well confine the breakdown region so that yield in processing can be improved.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A three dimension (3D) polysilicon read only memory (ROM), at least comprising:
    a silicon substrate;
    an isolated silicon dioxide ($SiO_2$) layer, which is deposited on the silicon substrate;
    a N-Type heavily doped (N+) polysilicon layer, which is deposited on the isolated $SiO_2$ layer and further defines a plurality of parallel, separate word lines (WL);
    a first oxide layer, which is filled in the space between the word lines;
    a dielectric layer, which is deposited on the word lines and the first oxide layer;
    a P-Type lightly doped (P−) polysilicon layer, which is deposited on the dielectric layer and further defines a plurality of parallel, separate bit lines (BL), wherein the bit lines overlap the word lines, from a top view, to form a shape that defines a cross;
    at least a neck structure, which are individually formed between the N-type heavily doped (N+) polysilicon layer and the P-type lightly doped (P−) polysilicon layer by isotropically etching the dielectric layer and using dilute hydrofluoric acid (HF); and
    a second oxide layer, which is filled in the space between the bit lines and is on the word lines and the first oxide layer.

2. The 3D polysilicon ROM according to claim 1, wherein the N-Type heavily doped (N+) polysilicon layer is a sandwich structure of polysilicon/silicide/polysilicon.

3. The 3D polysilicon ROM according to claim 1, wherein the P-Type lightly doped (P−) polysilicon layer is a sandwich structure of polysilicon/silicide/polysilicon.

4. The 3D polysilicon ROM according to claim 1, wherein the first oxide layer and the second oxide layer are filled by high density plasma in the space between the word lines and between the bit lines, respectively.

5. The 3D polysilicon ROM according to claim 1, wherein the first oxide layer and the second oxide layer are made of silicon nitride ($Si_3N_4$).

6. The 3D polysilicon ROM according to claim 1, wherein the first oxide layer and the second oxide layer are made of Borophosphosilicate glass (BPSG).

7. The 3D polysilicon ROM according to claim 1, wherein the first oxide layer and the second oxide layer are made of a polymer.

8. The 3D polysilicon ROM according to claim 1, wherein the first oxide layer and the second oxide layer are made of a low K material.

9. The 3D polysilicon ROM according to claim 1, wherein the material of the dielectric layer is selected from a group consisting of silicon dioxide ($SiO_2$), silicon nitride ($Si_3N_4$), aluminum oxide ($Al_2O_3$), hafnium oxide ($HfO_2$) and zirconium oxide ($ZrO_2$).

10. A 3D polysilicon ROM, at least comprising;
 a silicon substrate;
 depositing an isolated $SiO_2$ layer on the silicon substrate;
 a plurality of parallel, separate word lines (WL), which are defined on the isolated $SiO_2$ layer;
 a plurality of parallel, separate first bit line (BL) sections, which are formed on the word lines separately;
 a plurality of parallel, separate dielectric sections, which are formed below the first BL sections one by one, each one being with respect to the first BL sections thereon and all being on the word lines;
 at least a neck structure, which are individually formed for the dielectric sections with respect to the second bit lines thereon;
 a first oxide layer, which is filled in the space between the word lines, in the space between the first BL sections, in the space between the dielectric sections, and is on the word lines;
 a plurality of parallel, separate second bit lines, which are defined on the first BL sections and on the first oxide layer, wherein the second bit lines overlap the word lines, from a top view, to form a shape approximately as a cross and the second bit lines are electrically coupled to the first BL sections thereabout; and
 a second oxide layer which is filled in the space between the second bit lines and is on the first oxide layer over the word lines.

11. The 3D polysilicon ROM according to claim 10, wherein the first oxide layer and the second oxide layer are filled by high density plasma in the space between the word lines and between the second bit lines, respectively.

12. The 3D polysilicon ROM according to claim 10, wherein the first oxide layer and the second oxide layer are made of silicon nitride ($Si_3N_4$).

13. The 3D polysilicon ROM according to claim 10, wherein the first oxide layer and the second oxide layer are made of Borophosphosilicate glass (BPSG).

14. The 3D polysilicon ROM according to claim 10, wherein the first oxide layer and the second oxide layer are made of a polymer.

15. The 3D polysilicon ROM according to claim 10, wherein the first oxide layer and the second oxide layer are made of a low K material.

16. The 3D polysilicon ROM according to claim 10, wherein the material of the dielectric layer is selected from a group consisting of silicon dioxide ($SiO_2$), silicon nitride ($Si_3N_4$), aluminum oxide ($Al_2O_3$), hafnium oxide ($HfO_2$) and zirconium oxide ($ZrO_2$).

* * * * *